United States Patent
Lee et al.

(10) Patent No.: US 8,532,314 B2
(45) Date of Patent: Sep. 10, 2013

(54) AUDIO VOLUME CONTROL CIRCUIT AND METHOD THEREOF

(75) Inventors: Yi-Lin Lee, Hsinchu Hsien (TW); Bo-Ju Chen, Hsinchu Hsien (TW); Zhi-Ren Chang, Hsinchu Hsien (TW)

(73) Assignee: Mstar Semiconductor, Inc., Hsinchu Hsien (TW)

( * ) Notice: Subject to any disclaimer, the term of this patent is extended or adjusted under 35 U.S.C. 154(b) by 270 days.

(21) Appl. No.: 12/938,011

(22) Filed: Nov. 2, 2010

(65) Prior Publication Data
US 2011/0158432 A1  Jun. 30, 2011

(30) Foreign Application Priority Data
Dec. 30, 2009  (TW) ............................... 98145938 A

(51) Int. Cl.
*H03G 3/00* (2006.01)
*H03G 7/00* (2006.01)

(52) U.S. Cl.
USPC ............................ 381/107; 381/104; 381/109

(58) Field of Classification Search
USPC .......................... 381/101, 102, 104, 107, 170
See application file for complete search history.

(56) References Cited

U.S. PATENT DOCUMENTS

| | | | | |
|---|---|---|---|---|
| 5,369,711 A * | 11/1994 | Williamson, III | ............ | 381/104 |
| 5,371,803 A * | 12/1994 | Williamson, III | ............ | 381/104 |
| 6,198,830 B1 * | 3/2001 | Holube et al. | ................ | 381/321 |
| 6,535,846 B1 * | 3/2003 | Shashoua | ....................... | 704/225 |
| 6,868,162 B1 * | 3/2005 | Jubien et al. | ................... | 381/107 |
| 7,995,775 B2 * | 8/2011 | Chen | ............................. | 381/107 |
| 8,107,643 B2 * | 1/2012 | Oh et al. | ........................ | 381/107 |
| 2002/0173864 A1 * | 11/2002 | Smith | .............................. | 700/94 |
| 2007/0058822 A1 * | 3/2007 | Ozawa | ........................ | 381/94.1 |
| 2007/0237343 A1 * | 10/2007 | Schobben et al. | ............ | 381/111 |
| 2008/0013745 A1 * | 1/2008 | Chen | ............................... | 381/57 |
| 2009/0161883 A1 * | 6/2009 | Katsianos | ........................ | 381/57 |
| 2010/0142729 A1 * | 6/2010 | Noguchi | ....................... | 381/107 |

FOREIGN PATENT DOCUMENTS

CN   1725827 A   1/2006

OTHER PUBLICATIONS

Author: Ying-Wen Bai Title: The Combination of Kaiser Window and Moving Average for the Low-Pass Filtering of the Remote ECG Signals. Date: Jun. 24, 2004 Publish: Computer-Based Medical Systems, 2004. CBMS 2004, 17th IEEE Symposium.*
State Intellectual Property Office of the People's Republic of China, "Office Action", Mar. 5, 2013, China.

* cited by examiner

*Primary Examiner* — Xu Mei
*Assistant Examiner* — William A Jerez Lora
(74) *Attorney, Agent, or Firm* — WPAT, PC; Justin King

(57) ABSTRACT

An audio volume control circuit includes a signal intensity calculating circuit for generating a first signal intensity value corresponding to a signal intensity corresponding to an audio channel data; a low-pass filter for filtering the first signal intensity to generate a second signal intensity value; an averaging unit for averaging the second signal intensity value and previous M−1 second signal intensity values to obtain a third signal intensity value, with M being a natural number greater than 1; a gain calculating circuit for obtaining an original gain value according to the third signal intensity value with reference to the adjustment condition; a buffer for temporarily storing the audio channel data; and an audio volume adjusting circuit for generating an adjustment gain value according to the original gain value to adjust the audio channel data stored in the buffer.

15 Claims, 6 Drawing Sheets

US 8,532,314 B2

AUDIO VOLUME CONTROL CIRCUIT AND METHOD THEREOF

CROSS REFERENCE TO RELATED PATENT APPLICATION

This patent application is based on Taiwan, R.O.C. patent application No. 098145938 filed on Dec. 30, 2009.

FIELD OF THE INVENTION

The present invention relates to an audio volume control circuit and a method thereof, and more particularly, to an audio volume control circuit and a method thereof having automatic volume control (AVC).

BACKGROUND OF THE INVENTION

Nowadays, as technologies develop day by day, an audio volume control circuit having AVC is widely applied to various types of electronic products. For example, the audio volume control circuit is applied to a digital television (TV). When intensity of audio broadcasted by the digital TV dramatically changes, e.g., when a channel is changed or an advertisement is inserted, the audio volume control circuit automatically generates an adjustment gain value for adjusting audio volume to maintain the intensity of audio within a predetermined range, so that a user cannot perceive that the audio volume substantially changes when the channel changed or the advertisement is inserted to avoid uncomfortable audio.

Generally, in order to accurately determine an intensity change trend, a conventional audio volume controller needs to calculate an adjustment gain value with reference to a plurality of audio signals. Accordingly, a delay time, td, for controlling the audio signals by the conventional audio volume control circuit may be long. Refer to FIG. 1 showing a signal graph of operations of the conventional audio volume control circuit, and a signal S represents an audio signal controlled by the conventional audio volume control circuit. When an intensity of the signal S is over-increased at a time point T1, the conventional audio volume control circuit only responds to the over-increased intensity at a time point T2 to generate the adjustment gain value to restrain the intensity of the signal S. A period between the time point T1 and the time point T2 is defined as a delay time, td.

In order to solve the problem that the time delay td is too long, the conventional audio volume control circuit needs to define a long buffer to store audio data at these time points. Accordingly, cost of the conventional audio volume control circuit is too high to reduce product competitiveness.

SUMMARY OF THE INVENTION

The present invention provides an audio volume control circuit and a method thereof having advantages of reducing a size of a buffer, reducing cost, and shortening a delay time for AVC.

According to an embodiment of the present invention, an audio volume control circuit applied to generate an adjustment gain value for adjusting a plurality of audio data of a plurality of channels comprises a signal intensity calculating circuit, a low-pass filter, an averaging unit, a gain calculating circuit, a buffering circuit and an audio volume adjusting circuit. The signal intensity calculating circuit receives and generates a first signal intensity value corresponding to signal intensity corresponding to an audio channel data. The low-pass filter low-pass filters the first signal intensity value to generate a second signal intensity value. The averaging unit receives the second signal intensity value, and averages the second signal intensity value and previous M−1 second signal intensity values at previous M−1 time points to obtain a third signal intensity value, where M is a natural number greater than 1. The gain calculating circuit obtains an original gain value according to the third signal intensity value with reference to at least one adjustment condition. The buffer temporarily stores the audio channel data. The audio adjusting circuit generates an adjustment gain value according to the original gain value, and adjusts the audio channel data stored in the buffer according to the adjustment gain value.

According to another embodiment of the present invention, and audio volume control method is applied to generate an adjustment gain value to adjust a plurality of audio channel data of a plurality of channels. The method comprises generating a first signal intensity value corresponding to a signal intensity corresponding to an audio channel data; low-pass filtering the first signal intensity value to generate a second signal intensity value; averaging the second signal intensity value and previous M−1 second signal intensity values at previous M−1 time points to obtain a third signal intensity, where M is a natural number greater than 1; obtaining an original gain value according to the third signal intensity value with reference to an adjustment condition; temporarily storing the audio channel data into a buffer; and generating an adjustment gain value according to the original gain value, and adjusting the audio channel data stored in the buffer according to the adjustment gain value.

The advantages and spirit related to the present invention can be further understood via the following detailed description and drawings.

DETAILED DESCRIPTION OF THE PREFERRED EMBODIMENT

Figure 1:
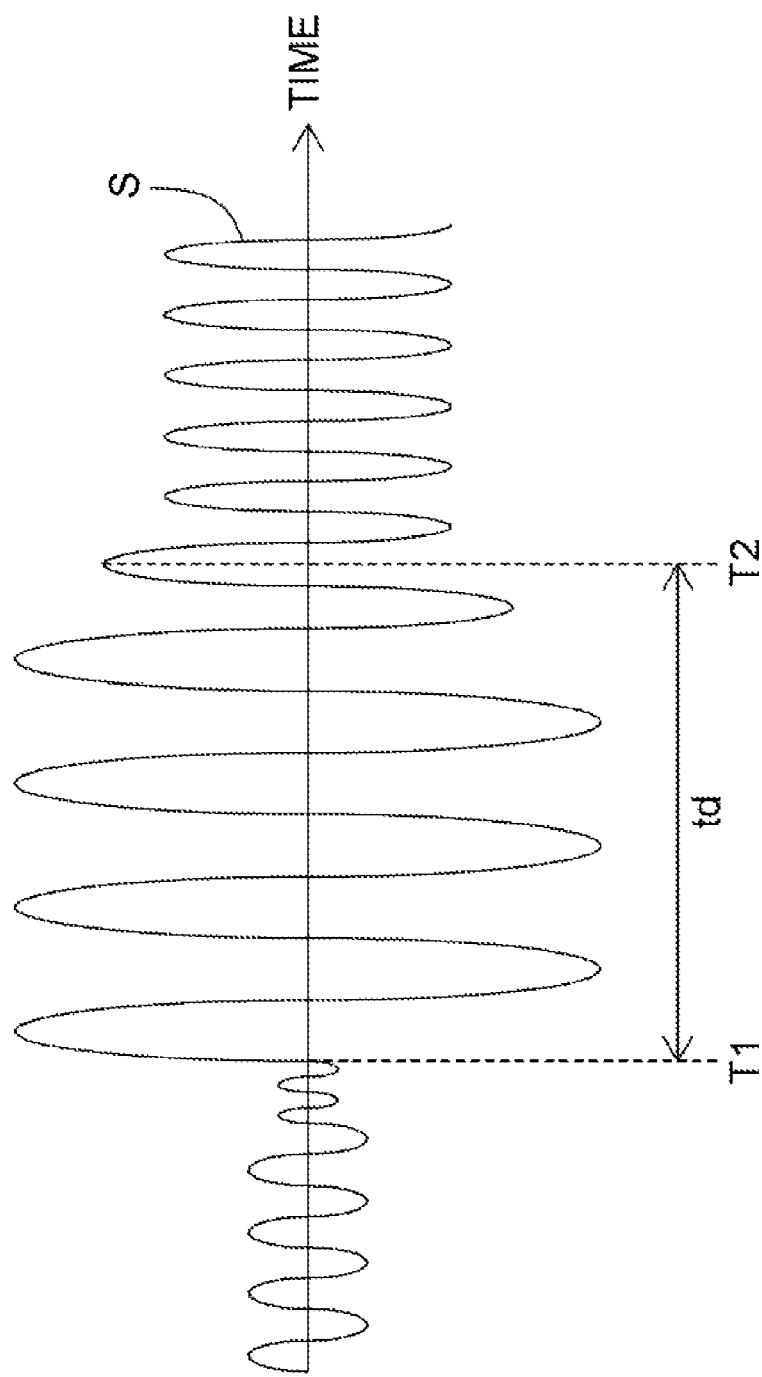
FIG. 1 is a signal graph of operations of a conventional audio volume control circuit.
Figure 2:
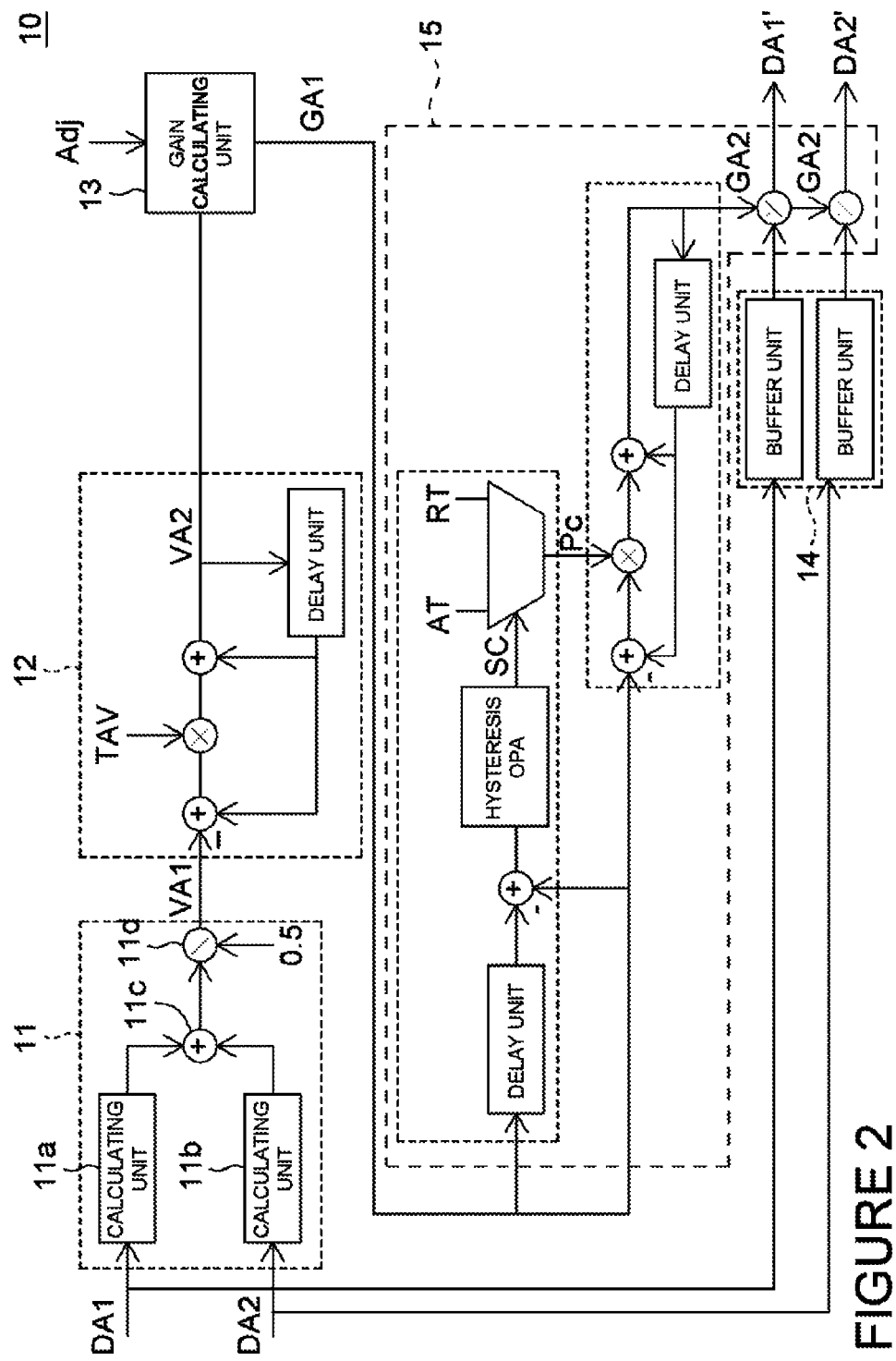
FIG. 2 is a block diagram of an audio volume control circuit.

Refer to FIG. 2 showing a block diagram of an audio volume control circuit 10, which comprises a signal intensity calculating circuit 11, a low-pass filter 12, a gain calculating circuit 13, a buffer 14, and an audio adjusting circuit 15. The signal intensity calculating circuit 11 receives at least one channel data of at least one audio channel, and calculates and obtains a signal intensity value VA1. The signal intensity calculating circuit 11 comprises calculators 11a, 11b, an adder 11c and a multiplier 11d. The calculators 11a and 11b respectively receive an audio channel data DA1 and an audio channel data DA2. The adder 11c calculates a sum of the audio channel data DA1 and the audio channel data DA2. The multiplier 11d multiplies the sum of the audio channel data DA1 and the audio channel data DA2 by a parameter, e.g., a number 0.5, to obtain the signal intensity value VA1. In this embodiment, the two audio channel data are averaged to compensate for any inequality of the two channel audio volumes.

In response to a calculating time parameter TAV, the low-pass filter 12 low-pass filters the signal intensity value VA1 corresponding to the calculating time parameter TAV during a calculating time period to obtain a second signal intensity value VA2.

The gain calculating circuit 13 calculates the signal intensity value VA2 with reference to an adjustment condition Adj to obtain an original gain value GA1. The buffer 14 temporarily stores the audio data DA1 and DA2 having predetermined length. The audio adjusting circuit 15 generates an adjustment gain value GA2 according to the original gain value GA1, and adjusts the audio channel data DA1 and DA2 stored in the buffer 13 according to the adjustment gain value GA2 to respectively generate adjusted audio channel data DA1' and DA2'. Accordingly, the audio volume control circuit 10 performs appropriate audio volume adjustment on the received audio channel data DA1 and DA2.

However, in order to obtain good audio volume adjustment quality, the calculating time parameter TAV of the circuit as shown in FIG. 2 is increased to reduce a bandwidth of the low-pass filter 12. Therefore, the audio volume control circuit 10 needs a longer time period to obtain variations of audio volumes to correspondingly generate the adjustment gain value for adjusting the channel DA stored in the buffer 14. Therefore, the buffer 14 may be not large enough to perform real-time adjustment on audio volumes with substantial variation, thereby incurring uncomfortable feelings of a user due to over-loud audios. Since a large buffer 14 is needed in this example, cost of the audio volume control circuit 10 is increased.

Figure 3:
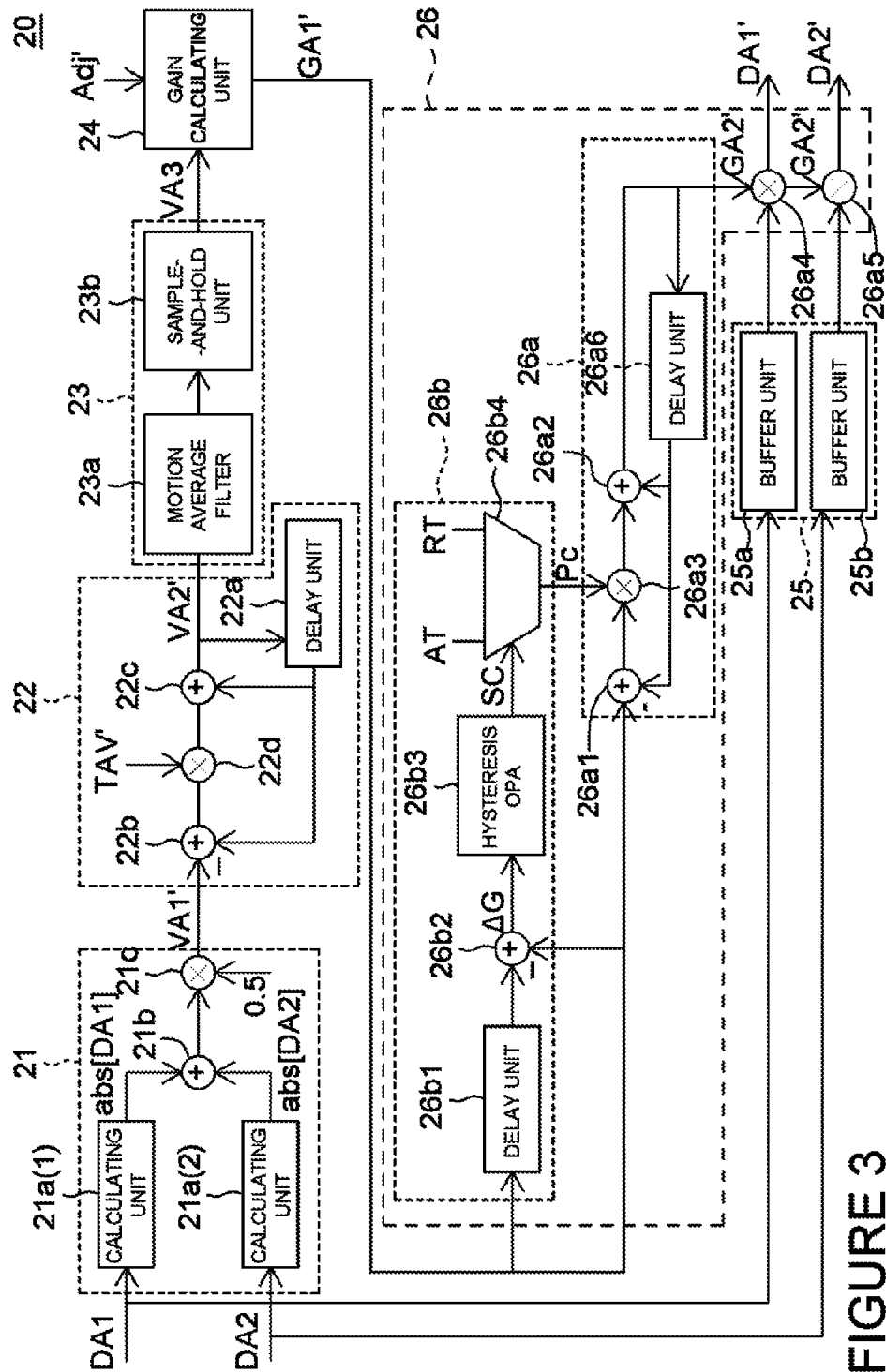
FIG. 3 is a block diagram of an audio volume control circuit in accordance with an embodiment of the present invention.

FIG. 3 shows a block diagram of an audio volume control circuit in accordance with an embodiment of the present invention. An audio volume control circuit 20 comprises a signal intensity calculating circuit 21, a low-pass filter 22, an averaging unit 23, a gain calculating circuit 24, a buffer 25, and an audio volume adjusting circuit 26. In this embodiment, by using the averaging unit 23, large storage space of buffer 14 of the audio volume control circuit 10 in FIG. 2 is no longer needed, so the cost of the audio volume control circuit 20 is reduced.

The signal intensity calculating circuit 21 receives a plurality of channel data within i number of channels, and obtains a signal intensity value VA1 according to the channel data, where i is a natural number greater than 1. For example, supposing that i is equal to 2, two channel data DA1 and DA2 in the two channels are respectively a left-channel data and a right-channel data. In this embodiment, the signal intensity calculating circuit 21 comprises calculators 21a(1) and 21a(2), which respectively perform absolute calculation on the audio channel data DA1 and DA2 to respectively calculate two channel data abs[DA1] and abs[DA2].

The signal intensity calculating circuit 21 further comprises calculators 21b and 21c to obtain a data average value of the two channel data abs[DA1] and abs[DA2] as a signal intensity value VA1' for output. For example, the calculator 21b and 21c respectively perform an adding calculation and a multiplying calculation.

The low-pass filter 22 low-pass filters the signal intensity value VA1' to generate a signal intensity value VA2'. For example, the low-pass filter 22 is an infinite impulse response (IIR) filter comprising a delay unit 22a, adders 22b and 22c, and a multiplier 22d. The delay unit 22a outputs to the adders 22b and 22c the signal intensity value VA2' obtained at a previous time point. The adder 22b calculates a difference between the signal intensity value VA1' and the signal intensity value VA2' at the previous time point. The multiplier 22d multiplies the difference generated by the adder 22b by a calculating time parameter TAV' to obtain a second calculation value. The adder 22c adds up the second calculation value and the signal intensity value VA2' obtained at the previous time point to obtain and output the current signal intensity value VA2'.

The calculating time parameter TAV' is associated with a cutoff frequency of the low-pass filter 22, i.e., the calculating time parameter TAV' is associated with the time spent for performing average calculation by the low-pass filter 22. A smaller calculating time parameter TAV' represents a shorter time length for performing average calculations by the low-pass filter 22, and that the cutoff frequency of the low-pass filter 22 is higher. For example, when the calculating time parameter TAV' corresponds to time length 100 ms, the low-pass filter 22 averages the signal intensity values VA1' approximately within 100 ms to complete the low-pass filtering.

The averaging unit 23 receives the signal intensity VA2', and averages the signal intensity value VA2' and previous M−1 number of signal intensity values VA2' associated with previous M−1 time points to obtain the signal intensity value VA3, where M is a natural number greater than 1. In one embodiment, the averaging unit 23 includes a moving average filter 23a and a sample-and-hold unit 23b. The averaging unit 23 may be a weight averaging unit for providing weight average values.

The moving average filter 23a is a finite impulse response (FIR) filter for example. Supposing that M is equal to 48, a transfer function H(z) of the FIR filter is as follows:

$$H(z) = \frac{1}{48} \times (1 + Z^{-1} + Z^{-2} + Z^{-3} + \ldots + Z^{-47}).$$

The moving average filter 23a performs total average of signal intensity values VA2' respectively delayed by 47, 46, 45, . . . , and 0 cycles to obtain a moving average value.

The sample-and-hold unit 23b samples the moving average value calculated by the moving average filter 23a every several cycles to generate the signal intensity value VA3.

The gain calculating circuit 24 adjusts the signal intensity value VA3 with reference to an adjustment condition Adj' to obtain an adjusted signal intensity value, and obtains an original gain value GA1' according to the signal intensity value VA3 and the adjusted signal intensity value. For example, the gain calculating circuit 24 determines whether the signal intensity value VA3 is higher than an intensity threshold value Vth to adjust the signal intensity value VA3. When the signal intensity value VA3 is greater than the intensity threshold Vth, the gain calculating circuit 24 generates the adjusted signal intensity value substantially equal to the intensity threshold Vth. When the signal intensity value VA3 is smaller than the intensity threshold Vth, the gain calculating circuit 24 generates the adjusted signal intensity value substantially j times of the signal intensity value VA3, where j is a real number, e.g., 2.

Figure 4:
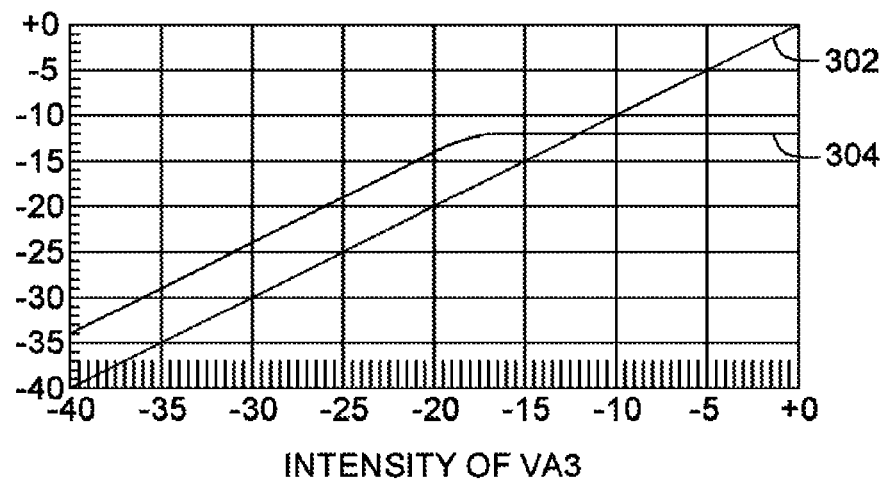
FIG. 4 is a schematic diagram of a gain relationship of a gain calculating circuit.

For example, refer to FIG. 4 showing a schematic diagram of a gain relationship of the gain calculating circuit 24. A horizontal coordinate represents intensity of the signal intensity value VA3, and a vertical coordinate represents intensity of the adjusted intensity value VA3'. Curve 302 represents the relationship when the gain calculating circuit 24 is not adjusted yet, and curve 304 represents the relationship with the adjusted gain calculating circuit 24. Suppose that the intensity threshold Vth is equal to −12 dB, and j is equal to 2. Accordingly, when the signal intensity value VA3 is smaller than −12 dB, the gain calculating circuit 24 generates the adjusted signal intensity value substantially equal to twice the signal intensity value VA3, i.e., intensity of the adjusted signal intensity value is equal to the sum of the signal intensity value VA3 adding 6 dB. When the signal intensity value VA3 is greater than −12 dB, the adjusted signal intensity value generated by the gain calculating circuit 24 maintains at −12 dB.

The gain calculating circuit 24 generates the original gain value GA1' according to an equation:

$$GA1' = \frac{VA3'}{VA3}.$$

Where VA3' is the adjusted signal intensity value, and thus the gain calculating circuit 24 generates the original gain value GA1' according to the signal intensity value VA3 and the adjusted signal intensity value.

The buffer 25 comprises buffering units 25a and 25b, which are for respectively temporarily storing the audio channel data DA1 and DA2. The audio volume adjusting circuit 26 generates an adjustment gain value GA2' according to the original gain value GA1', and adjusts the audio channel data DA1 and DA2 stored in the buffer 25 according to the adjustment gain value GA2' to respectively generate adjusted audio channel data DA1' and DA2'.

The audio volume adjusting circuit 26 comprises a convergence calculation unit 26a and a gain variation rate detecting unit 26b. The gain variation rate detecting unit 26b receives the original gain value GA1', and determines whether a variation of the original gain value GA1' is increasing or decreasing, so as to determine whether audio volumes corresponding to the audio channel data DA1 and DA2 are increasing or decreasing, and to correspondingly determine whether an increasing convergence parameter AT or a decreasing convergence parameter RT serves as a convergence parameter Pc to be outputted. The convergence calculation unit 26a obtains the adjustment gain value GA2' according to the convergence parameter Pc and the original gain value GA1'.

More specifically, the gain variation rate detecting unit 26b comprises a delay unit 26b1, an adder 26b2, a hysteresis operational amplifier 26b3, and a multiplexer 26b4. The delay unit 26b1 outputs a previous original gain value GA1' to the adder 26b2, then the adder 26b2 calculates the difference ΔG between the previous original gain value GA1' and the original gain value GA1'. The hysteresis operational amplifier 26b3 receives the difference ΔG, and generates the hysteresis control signal SC.

Figure 5:
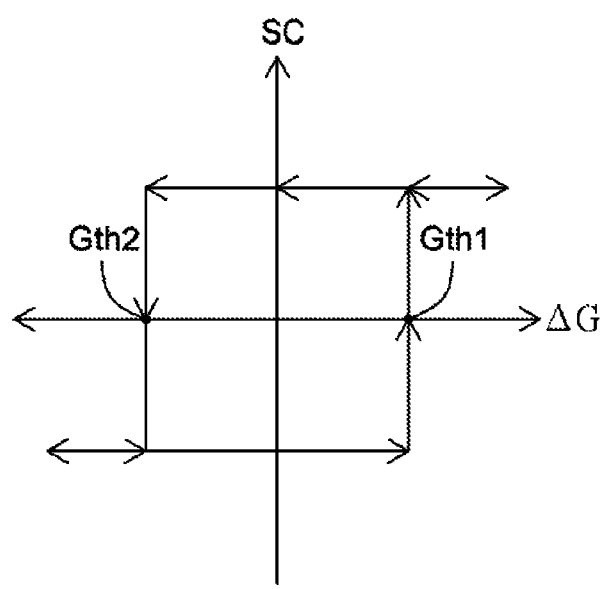
FIG. 5 is a schematic diagram of an input/output (I/O) relationship of a hysteresis operational amplifier.

Refer to FIG. 5 showing a schematic diagram of an I/O relationship of the hysteresis operational amplifier 26b3 in this embodiment. When the difference ΔG is greater than a high threshold Gth1, the hysteresis operational amplifier 26b3 determines that the variation of the difference ΔG is increasing, and generates a first level of hysteresis control signal SC. When the difference ΔG is smaller than a low threshold Gth2, the hysteresis operational amplifier 26b3 determines that the variation of the difference ΔG is decreasing, and generates a second level of hysteresis control signal SC. When the difference ΔG is between the threshold Gth1 and the threshold Gth2, the hysteresis operational amplifier 26b3 does not change the level of the hysteresis control signal SC.

In response to the first level of hysteresis control signal SC, the multiplexer 26b4 selects and outputs the gradually-increased convergence parameter AT as the convergence parameter Pc; in response to the second level of hysteresis control signal SC, the multiplexer 26b4 selects and outputs the gradually-reduced convergence parameter RT as the convergence parameter Pc. Preferably, the increasing convergence parameter AT and the decreasing convergence parameter RT are different.

The convergence calculating unit 26a comprises adders 26a1 and 26a2, a multiplier 26a3, and a delay unit 26a6. The delay unit 26a6 outputs a previous adjustment gain value GA2' to the adders 26a1 and 26a2. The adder 26a1 generates a difference between a current original gain value GA1' and a current adjustment gain value GA2'. The multiplier 26a3 multiplies the difference provided by the adder 26a1 by the convergence parameter Pc to obtain a convergence-calculated difference. The adder 26a3 adds up the convergence-calculated difference and the previous adjustment gain value GA2' to generate the current adjustment gain value GA2'.

The audio volume adjusting circuit 26 further comprises multipliers 26a4 and 26a5. The multipliers 26a4 and 26a5 respectively receive the audio channel data DA1 and DA2 temporarily stored in the buffer 25, and respectively adjust the audio channel data DA1 and DA2 according to the adjustment gain value GA2' to respectively generate the adjusted audio channel data DA1' and DA2'. The audio channel data DA1 and DA2 are adjusted according to the corresponding adjustment gain value GA2'. That is, when the audio channel data DA1 and DA2 outputted by the current buffering unit 25a and 25b are those inputted into calculating units 21a(1) and 21a(2) at a time point t, the adjustment gain value GA2' for adjusting the audio channel data DA1 and DA2 is generated on a basis of the audio channel data DA1 and DA2 inputted to the calculating units 21a(1) and 21a(2) at the time point t.

In this embodiment, the audio volume control circuit 20 generates the corresponding adjustment gain value GA2' when signal intensities of the corresponding audio channel data DA1 and DA2 vary according to a particular variation to adjust the audio channel data DA1 and DA2, so that the signal intensity of the audio channel data DA1 and DA2 are within a certain range.

As mentioned above, the audio volume control circuit 10 in FIG. 2 needs to increase the calculating time parameter TAV and reduce the bandwidth of the low-pass filter 12 to obtain better audio volume adjusting quality; however, the storage space of the buffer 14 needs to be increased accordingly. When storage space of the buffer 14 is reduced by directly reducing the calculating time parameter TAV in FIG. 2 and increasing the bandwidth of the low-pass filter 12, the signal intensity value VA2 outputted by the low-pass filter 12 may be substantially oscillated to incur incorrect determinations generated by the audio volume adjusting circuit 15, thereby generating an incorrect adjustment gain value that cannot accurately adjust the audio channel data DA1 and DA2.

Figure 6A:
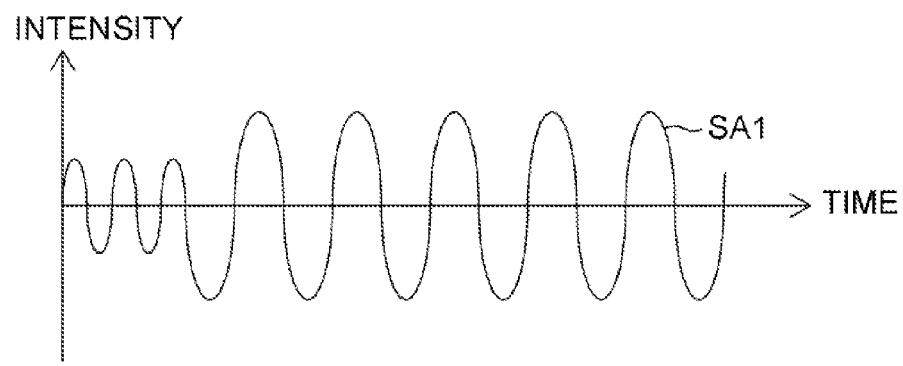
FIG. 6A and FIG. 6B are respectively schematic diagrams of waveforms of an audio channel signal and a signal intensity value VA1 corresponding to an audio channel data DA1.
Figure 6B:
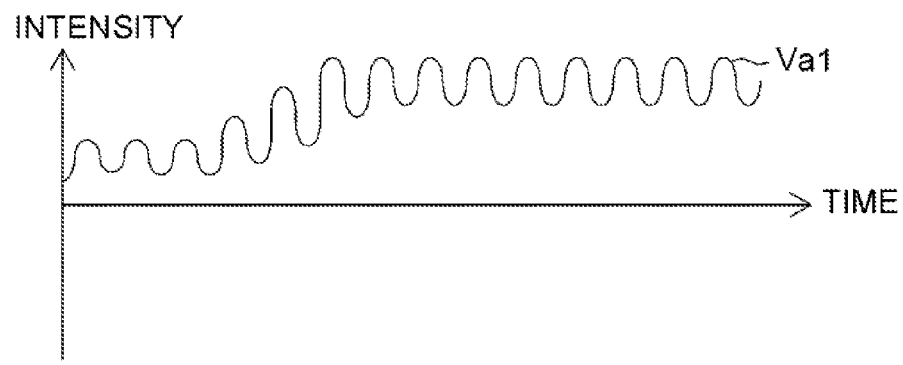

For example, refer to FIG. 6A and FIG. 6B showing schematic diagram of waveforms of an audio signal SA1 and the signal intensity value VA1 corresponding to the audio channel data DA1. When intensity of the audio signal SA1 changes to be larger, substantial jitter of the signal intensity value VA1 occurs.

In this embodiment, since the audio volume control circuit 20 in FIG. 3 has a small calculating time parameter TAV' and the low-pass filter 12 has a large bandwidth, the buffer 14 need not have large storage space. In order to avoid incorrect determinations generated by the audio volume adjusting circuit 15 due to substantial jitter of the signal intensity value VA1 generated by the audio volume control circuit 10 in FIG. 2, the averaging unit 23 is designed in the audio volume control circuit 20 in FIG. 3 to average the signal intensity value VA2' generated by the low-pass filter 22 to obtain the signal intensity value VA3.

Figure 7:
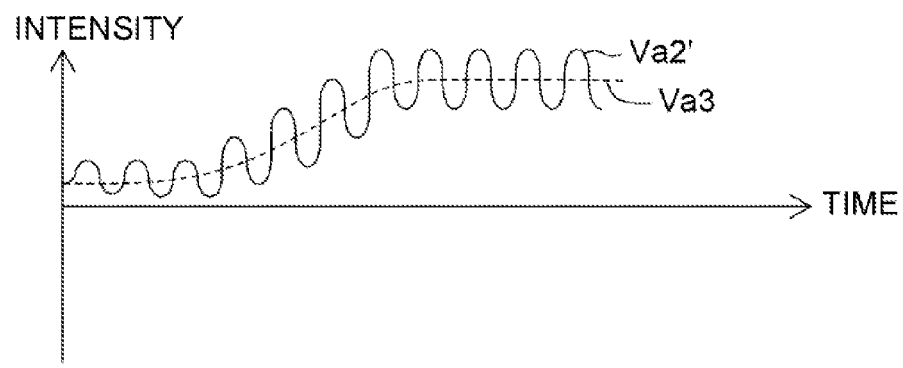
FIG. 7 is a schematic diagram of waveforms of a signal intensity value VA2' and VA3'.

For example, refer to FIG. 7 showing a schematic diagram of waveforms of the signal intensity values VA3 and VA2'. After being calculated by the averaging unit 23, intensity of the signal intensity value VA2' changes smoothly to generate the signal intensity value VA3 without the substantial jitter. Accordingly, when audio volume is substantially changed, the audio volume control circuit 20 in this embodiment immediately generates a corresponding adjustment gain value to adjust the audio volume, thereby shortening a delay time for AVC as well as reducing storage space of a buffer, so as to achieve advantages of obtaining high quality of audio processing and reducing cost.

In this embodiment, the high threshold Gth1 and the low threshold Gth2 of the hysteresis operational amplifier 26b3 are associated with intensity variation degrees of the original gain value GA1'. Preferably, when the jitter of the original gain value GA1' is rather serious, transition thresholds Gth1 and Gth2 of the hysteresis operational amplifier 26b3 need to be large values to avoid incorrect determinations of variation trends of the audio volume data DA1 and DA2. When the jitter of the original gain value GA1' is gentle, transition thresholds Gth1 and Gth2 of the hysteresis operational amplifier 26b3 can be accordingly defined as small values.

In this embodiment, M of the moving average filter 23a is adjusted according to statuses of the signal intensity value VA2'. M equal to 48 is taken as an example; however, the number of the signal intensity value VA2' calculated by the averaging unit 23 may be other values not limited to M. The transition thresholds Gth1 and Gth2 are also associated with M.

Figure 8:
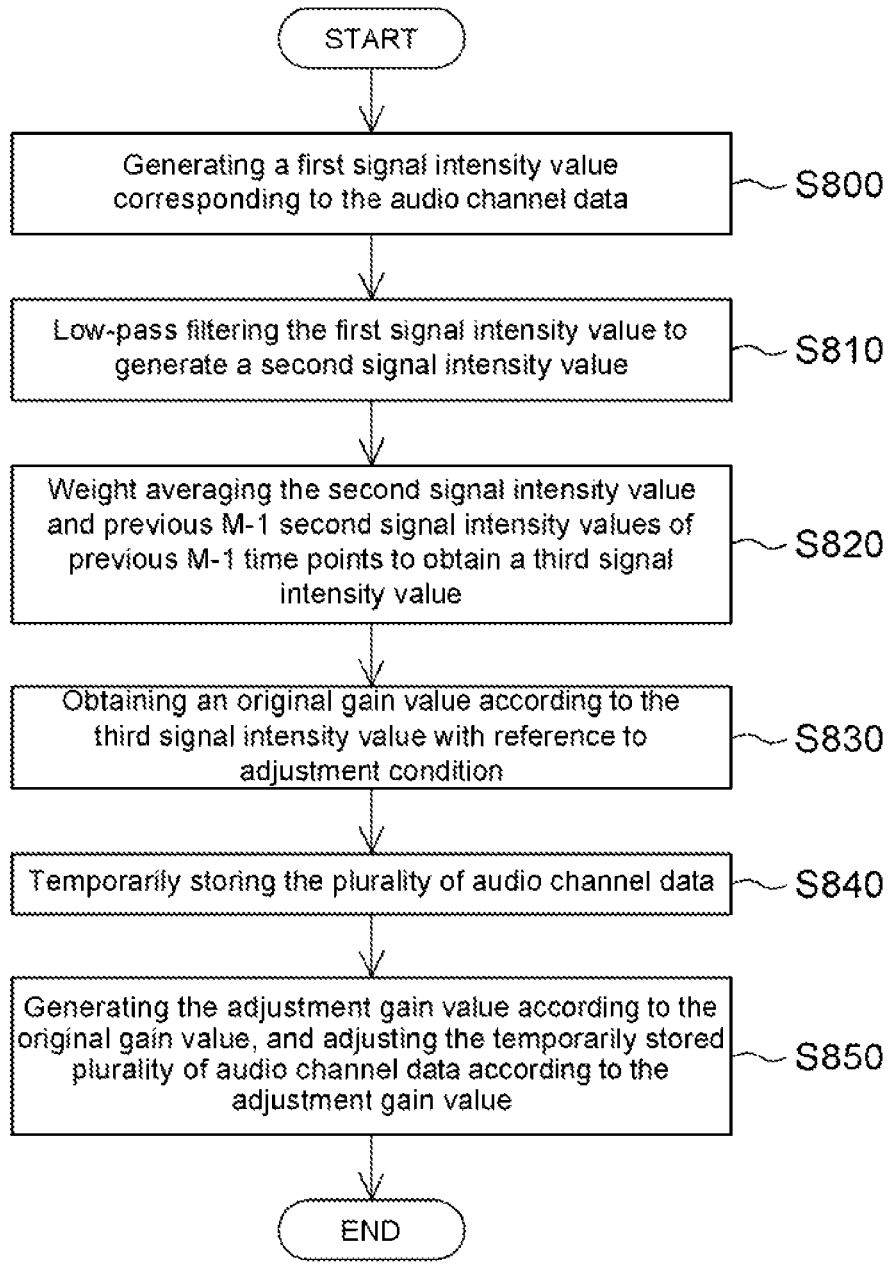
FIG. 8 is a flow chart of an audio volume control method in accordance with an embodiment of the present invention.

According to another embodiment of the present invention, an audio volume control method is disclosed to adjust a plurality of audio channel data within a plurality of audio channels. Refer to FIG. 8 showing a flow chart of the audio volume control method in accordance with another embodiment of the present invention. In Step S800, a first signal intensity value of signal intensity corresponding to an audio channel data is generated. In Step S810, the first signal intensity value is low-pass filtered to generate a second signal intensity value. In Step S820, the second signal intensity value and previous M−1 second signal intensity values of previous M−1 time points are averaged to obtain a third signal intensity value, where M is a natural number greater than 1. In Step S830, an original gain value is obtained according to the third signal intensity value with reference to an adjustment condition. In Step S840, the audio channel data is temporarily stored into a buffer. In Step S850, an adjustment gain value is generated according to the original gain value, and the audio channel data stored in the buffer is adjusted according to the adjustment gain value.

An operating principle of the foregoing audio volume control method is identical to that of the detailed description of the audio volume control circuit 20, and details thereof shall not be described for brevity.

According to the present invention, by appropriately defining an averaging unit of an audio volume control circuit, a calculating time parameter of a low-pass filter is reduced and requirements of storage space of buffering units of a buffer are substantially reduced. Accordingly, compared to the conventional audio volume control circuit, the audio volume control circuit according to the present invention has advantages of low cost and immediately converging audio volume to avoid audio popping.

While the invention has been described in terms of what is presently considered to be the most practical and preferred embodiments, it is to be understood that the invention needs not to be limited to the above embodiments. On the contrary, it is intended to cover various modifications and similar arrangements included within the spirit and scope of the appended claims which are to be accorded with the broadest interpretation so as to encompass all such modifications and similar structures.

What is claimed is:

1. An audio volume control circuit, for generating an adjustment gain value for adjusting a plurality of audio channel data of a plurality of audio channels, the circuit comprising:
    a signal intensity calculating circuit, for receiving the audio channel data to generate a first signal intensity value of signal intensity for the audio channel data;
    a low-pass filter, for low-pass filtering the first signal intensity value to generate a second signal intensity value;
    a weight averaging unit, for receiving the second signal intensity value, and averaging the second signal intensity value and previous M−1 second signal intensity values associated with previous M−1 time points to obtain a third signal intensity value, where M is a natural number greater than 1;
    a gain calculating circuit, for obtaining an original gain value according to the third signal intensity value with reference to an adjustment condition;
    a buffer, for temporarily storing the audio channel data; and
    an audio volume adjusting circuit, for generating the adjustment gain value according to the original gain value, and adjusting the audio channel data according to the adjustment gain value, comprises:
        a convergence calculating unit, for receiving the original gain value, and calculating the adjustment gain value according to a previous original gain value, the original gain value, and a convergence parameter; and
        a gain variation rate detecting unit, for receiving the original gain value, and determining whether a variation of the original gain value is increasing or decreasing according to a relationship between the original gain value and the previous original gain value, so as to correspondingly use an increasing convergence parameter or a decreasing convergence parameter as the convergence parameter.

2. The audio volume control circuit as claimed in claim 1, wherein the weight averaging unit comprises:
    a moving average filter, for performing moving average calculation on the second signal intensity value to generate a moving average value; and
    a sample-and-hold unit, for sampling the moving average value to obtain the third signal intensity value.

3. The audio volume control circuit as claimed in claim 2, wherein the moving average filter is a finite impulse response (FIR) filter, and the low-pass filter is an infinite impulse response (IIR) filter.

4. The audio volume control circuit as claimed in claim 1, wherein the adjustment condition is a threshold, and the gain calculating circuit determines whether the third signal intensity value is greater than the threshold to determine the original gain value.

5. The audio volume control circuit as claimed in claim 4, wherein when the third signal intensity value is smaller than the threshold, the gain calculating circuit amplifies the third signal intensity by a predetermined multiple in order to generate a fourth signal intensity value, and generates the original gain value according to a ratio of the fourth signal intensity value and the third signal intensity value.

6. The audio volume control circuit as claimed in claim 4, wherein when the third signal intensity value is greater than the threshold, the gain calculating circuit limits the third signal intensity value to the threshold in order to generate the fourth signal intensity value, and generates the original gain value according to a ratio of the fourth signal intensity value and the third signal intensity value.

7. The audio volume control circuit as claimed in claim 1, wherein the gain variation rate detecting unit comprises:
- a difference calculating unit, for receiving the original gain value and the previous original gain value, and calculating a difference between the original gain value and the previous original gain value;
- a hysteresis operational amplifier, for receiving the difference, and correspondingly generating a hysteresis control signal; and
- a multiplexer, for receiving the increasing convergence parameter and the decreasing convergence parameter, and outputting one of the increasing convergence parameter or the decreasing convergence parameter as the convergence parameter.

8. The audio volume control circuit as claimed in claim 7, wherein a threshold of the hysteresis operational amplifier is associated with the number M.

9. The audio volume control circuit as claimed in claim 1, wherein the audio volume adjusting circuit further comprises:
- a plurality of calculating units, for respectively multiplying the plurality of audio channel data by the adjustment gain value to correspondingly generate a plurality of adjusted audio channel data.

10. An audio volume control method, for generating an adjustment gain value to adjust a plurality of audio channel data of a plurality of audio channels, the method comprising:
- a. generating a first signal intensity value for the audio channel data;
- b. low-pass filtering the first signal intensity value to generate a second signal intensity value;
- c. weight averaging the second signal intensity value and previous M−1 second signal intensity values associated with previous M−1 time points to obtain a third signal intensity value, where M is natural number of greater than 1;
- d. obtaining an original gain value according to the third signal intensity value with reference to an adjustment condition;
- e. temporarily storing the audio channel data; and
- f. generating the adjustment gain value according to the original gain value, and adjusting the temporarily stored audio channel data according to the adjustment gain value; comprising:
  - f1. determining whether a variation trend of the original gain value is increasing or decreasing according to a relationship between the original gain value and a previous original gain value, so as to correspondingly select an increasing convergence parameter or a decreasing convergence parameter as a convergence parameter; and
  - f2. obtaining the adjustment gain value according to the original gain value, the previous original gain value and the convergence parameter.

11. The audio volume control method as claimed in claim 10, wherein a moving averaging unit is applied to perform average calculation during weight averaging.

12. The audio volume control method as claimed in claim 11, wherein low-pass filtering is performed by an infinite impulse response (IIR) filter, and the moving averaging unit is a finite impulse response (FIR) filter.

13. The audio volume control method as claimed in claim 10, wherein obtaining an original gain value comprises:
- when the third signal intensity value is smaller than a threshold, enlarging the third signal intensity value by a predetermined multiple to generate a fourth signal intensity value; and
- generating the original gain value according to a ratio of the third signal intensity value and the fourth signal intensity value.

14. The audio volume control method as claimed in claim 10, wherein generating the adjustment gain value comprises:
- determining whether a variation trend of the original gain value is increasing or decreasing according to a relationship between the original gain value and a previous original gain value, so as to correspondingly select an increasing convergence parameter or a decreasing convergence parameter as a convergence parameter; and
- obtaining the adjustment gain value according to the original gain value, the previous original gain value and the convergence parameter.

15. The audio volume control method as claimed in claim 10, wherein generating the adjustment gain value comprises multiplying the plurality of audio channel data by the adjustment gain value in order to correspondingly generate a plurality of adjusted audio channel data.

\* \* \* \* \*